United States Patent [19]
Helman

[11] Patent Number: 5,793,984
[45] Date of Patent: Aug. 11, 1998

[54] METHOD OF COMPUTER REPRESENTATION OF DATA

[75] Inventor: Daniel Helman, Los Gatos, Calif.

[73] Assignee: 8×8, Inc., Santa Clara, Calif.

[21] Appl. No.: 627,713

[22] Filed: Apr. 1, 1996

[51] Int. Cl.⁶ ..................................... H03M 7/40
[52] U.S. Cl. ..................... 395/200.77; 341/67; 348/17; 348/384
[58] Field of Search ............ 395/200.18, 200.17, 395/200.77, 611, 612, 613, 615; 364/514 R, 514 C; 341/67, 78; 370/352; 348/17, 384, 390, 394, 395; 371/2.1

[56] References Cited

U.S. PATENT DOCUMENTS

| | | |
|---|---|---|
| 4,864,572 | 9/1989 | Rechen et al. ............ 371/2.1 |
| 5,146,220 | 9/1992 | Ishikawa ..................... 341/67 |
| 5,289,465 | 2/1994 | Mouro et al. ............... 370/82 |
| 5,371,740 | 12/1994 | Mouro et al. ............ 370/85.1 |
| 5,414,425 | 5/1995 | Whiting et al. ............. 341/67 |
| 5,572,334 | 11/1996 | Tanaka ..................... 358/426 |

*Primary Examiner*—James P. Trammell
*Assistant Examiner*—Patrick Assouad

[57] ABSTRACT

A data representation method is disclosed wherein the length information of an arbitrary string of data bits along with the string of data bits is represented using the least number of bytes or words or other fixed-size bit groups. In accordance with the present invention, an arbitrary string of data bits is arranged sequentially in fixed-size bit groups, starting with a first group and ending with a last group each group having equal number of bit positions, whereby in the last group one or more bit positions remain unoccupied by data bits and a predesignated bit value is used to identify the bit positions not occupied by data bits.

11 Claims, 4 Drawing Sheets

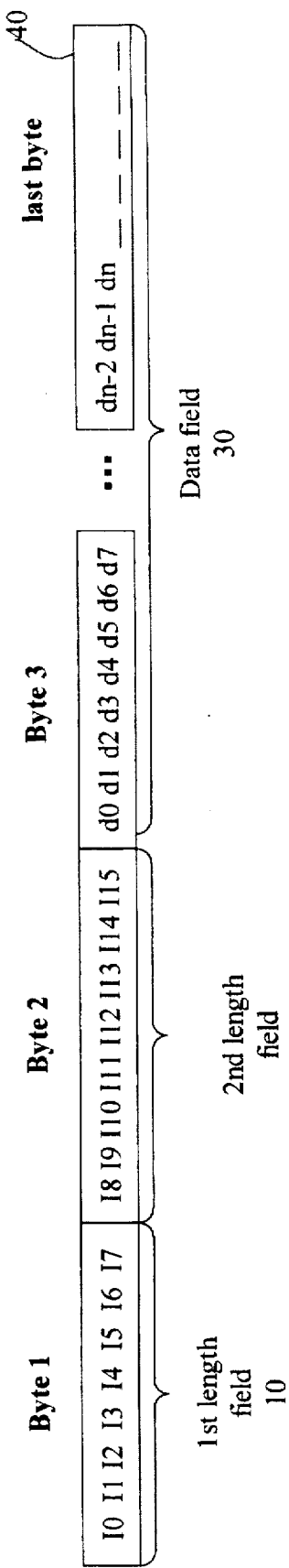
Fig. 1 - Prior Art
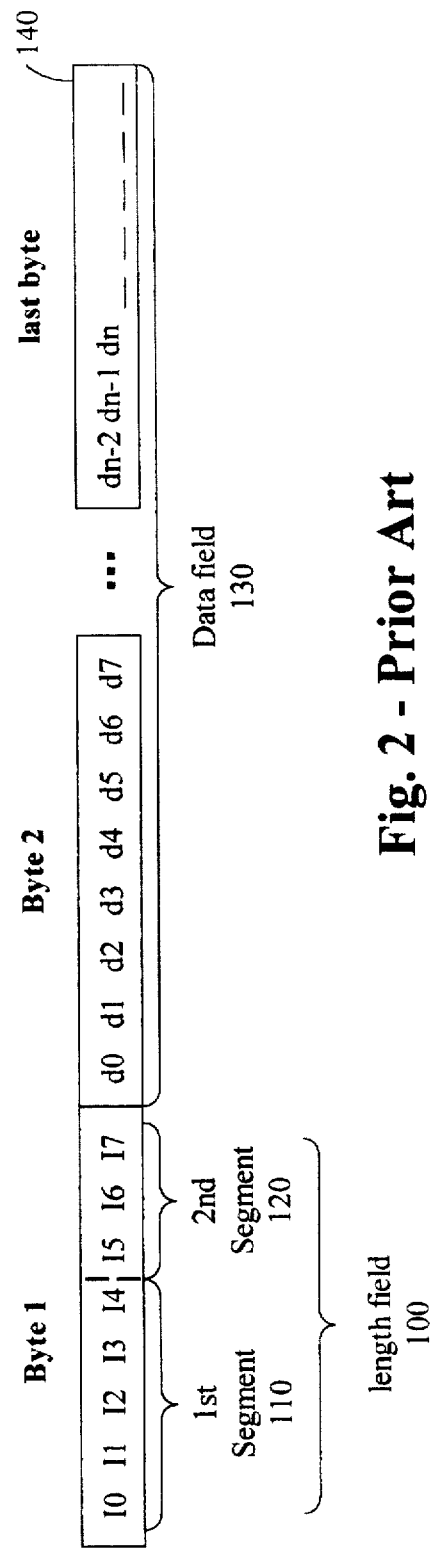
Fig. 2 - Prior Art

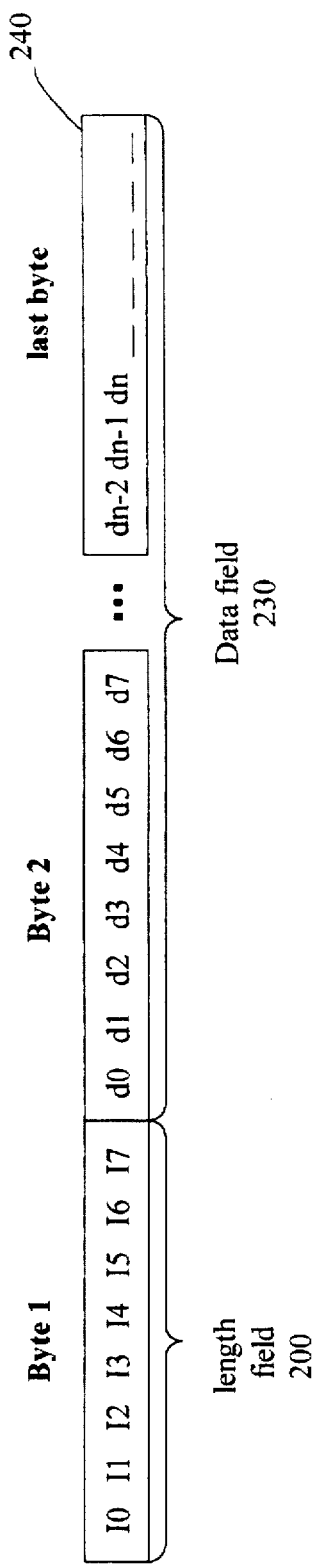

```
        /*
        ** Variable bit representation in a byte.
        **
        **
        **
        ** Store 0-7 bits in a single byte.
        */

/*
         * Given a number of bits (0 to 7) and that many bits of data
         * in the least significant bits of a byte, convert to the
         * encoded byte representation.
         */
(1)     unsigned char
(2)     EncodeLastByte(unsigned char data, unsigned length)
        {
(3)        data = 1 | (data << 1);      /* shift a 1 into the data */
(4)        data <<= 7 - length;         /* shift in 0 to 7 zeros    */
(5)        return data;
        }

/*
         * Given an encoded last byte, return the length in bits and the
         * data.  Undo the EncodeLastByte() function.
         */
(6)     unsigned
(7)     DecodeLastByte(unsigned char *pdata)
        {
(8)        unsigned length = 7;

(9)        while (0 == (1 & *pdata)) { /* if last bit is a zero */
(10)          length--;                 /* decrement length       */
(11)          *pdata >>= 1;             /* get rid of last bit    */
           }
(12)       *pdata >>= 1;                /* get rid of trailing 1 */
(13)       return length;
        }
```

Fig. 4 ial data. The purpose of the additional data is to provide the receiver with the necessary information about the raw data, such as the total number of bytes being transmitted, or the total number of data bits within the last byte.

It is quite apparent that in transmitting information, faster transmission times are achieved when the information is represented by fewer bits. Thus, an efficient data representation method can be advantageously used in any communication system where faster data transfer rates are of importance.

A typical prior art data representation method, wherein an arbitrary number of bits are represented in bytes (groups of eight bits), is shown in FIG. 1. As shown in FIG. 1, a string of bits, to be transmitted, is grouped in bytes and is partitioned into three fields—a first length field 10, a second length field 20, and a data field 30. Typically one byte is set aside for each length field, shown in FIG. 1 as "Byte 1" and "Byte 2". The first length field 10 typically carries the information (I0–I7) relating to the number of bytes of data within the data field 30. The second length field 20 typically carries the information (I8–I15) as to the number of data bits within the "last byte" 40 of the data field 30. For example, the "last byte" 40 in FIG. 1 is shown to carry three bits of data, namely dn-2, dn-1 and dn, while the other five bit positions are unused. Therefore, the information contained in the second length field 20 would indicate that the first three bit positions within the last byte 40 contain data.

This prior art method however, is inefficient in that two bytes are needed for the length information while another byte is needed to represent the remaining portion of the string of data. Therefore, three bytes are used in an inefficient manner.

Another prior art method is shown in FIG. 2, wherein a single byte is used to provide the length information contained in the first and the second fields of the FIG. 1 method. As shown in FIG. 2, the string of bits is partitioned into two fields, a length field 100 and a data field 130. The length field 100, for which one byte is set aside, is partitioned into two segments—a first segment 110 and a second segment 120. Similar to the two fields of the FIG. 1 method, the first segment 110 is used to provide the information (I0–I4) as to the total number of bytes of data within the data field 130, while the second segment 120 is used to provide the information (I5–I7) as to the total number of data bits within the last byte 140 of the data field 130.

METHOD OF COMPUTER REPRESENTATION OF DATA

FIELD OF THE INVENTION

The present invention relates in general to a method of computer representation of data. More particularly, it is directed to a data representation method wherein an arbitrary string of bits is efficiently represented by a minimum number of bytes or words or other fixed-size bit arrangements.

BACKGROUND

In communication systems or any system wherein data is generated in some format and is subsequently transmitted, a data representation method is needed. For example, in a video phone system the video picture is typically compressed into an arbitrary number of bits and is subsequently transmitted through a modem. The modem usually transmits the data in bytes or words or other bit arrangements.

Typically, the raw data is transmitted along with some addition

The second segment 120 is shown in FIG. 2 to occupy three bits of the length field 100, namely bit locations designated by I5, I6 and I7. These three bits are used to indicate which one of eight possible cases has arisen with respect the number of data bits in the last byte 140, i.e., "000" indicating the first bit position contains data, "001" indicating that the first and the second bit positions contain data, "010" indicating that the first three bit positions contain data, and so on. The remaining five bits (I0–I4) in the first segment 120 are used to indicate the transmission of up to 32 bytes of data.

Even though this method efficiently uses a single byte to provide the length information, its use however is limited to strings of data that are 32 bytes or smaller. Furthermore, as described earlier with respect the FIG. 1 method, the last byte 140 is not used in an efficient manner.

SUMMARY

In accordance with the present invention, a data representation method is disclosed wherein the information describing the length of an arbitrary string of data bits along with the string of data bits are represented using the least number of bytes or words or other bit arrangements. Hereinafter a byte representing eight bits will be used as the bit arrangement, although any other bit arrangements may also be used.

In accordance with the present invention, an arbitrary string of data bits is arranged sequentially in bytes starting with a first byte and ending with a last byte, whereby in the last byte one or more bit positions remain unoccupied by data bits and a predesignated bit format is used to identify the unoccupied bit positions.

The bit value in each bit position of the last byte is examined in the sequence opposite the sequence in which the data bits are arranged in the last byte, whereby the detection of a predesignated bit value indicates that all subsequent bit positions contain data bits.

The string of data bits may be arranged sequentially starting at the most significant bit position of each byte, in which case the bit value in each bit position of the last byte is examined sequentially starting with the least significant bit position.

Alternatively, the string of data bits may be arranged sequentially starting at the least significant bit position of each byte, in which case the bit value in each bit position of the last byte is examined sequentially starting with the most significant bit position.

The predesignated bit value may be represented by a high logic level in which case the remaining unoccupied bit positions are represented by a low logic level. Alternatively, the predesignated bit value may be represented by a low logic level in which case the remaining unoccupied bit positions are represented by a high logic level.

One feature of the present invention is that in most cases (⅞th of the cases) one less byte or segment is required to communicate to the receiver the length of data within the last byte.

Another feature of the present invention is that the length field can be used to solely provide the byte information with respect the data field. Therefore, the byte information of the data field can be optimized independent of the bit information of the last byte.

These and other features and advantages of the present invention will become more apparent from the following description and the accompanying drawings.

3

BRIEF DESCRIPTION OF THE DRAWINGS

FIG. 1 shows a first conventional data representation method wherein two bytes are used in providing the length information.

FIG. 2 shows a second conventional data representation method wherein one byte is used in providing the length information.

FIGS. 3a–3b show a method of data representation in accordance with a specific embodiment of the present invention.

FIG. 4 shows a software implementation of the specific embodiment of the present invention shown in FIGS. 3a–3b.

DETAILED DESCRIPTION OF THE PREFERRED EMBODIMENT

Figure 5:
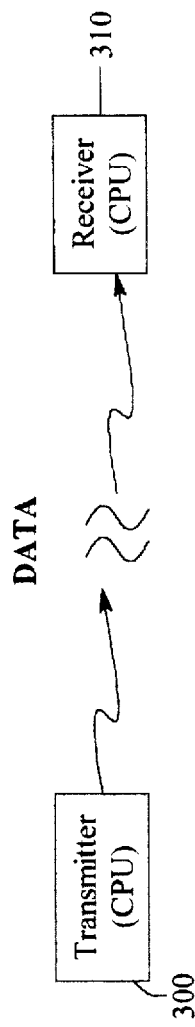
FIG. 5 illustrates a communication system constructed and arranged to process and represent data, according to an embodiment of the present invention.

One specific embodiment of the present invention is shown in FIGS. 3a–3b. As shown in FIG. 3a, a string of bits is partitioned into two fields, a length field 200 and a data field 230. The length field 200 carries information (I1–I7) as to the number of bytes of data within the data field 230. For example, the length field 200 containing the binary number 00000101 indicates that a total of 5 bytes of data exist in the data field 230. In this manner up to a total of 256 bytes may be designated by the length field 200.

The string of data bits (d0–dn) contained within the data field 230 is divided into groups of eight bits (bytes), as shown in FIG. 3a. In dividing the data bits in groups of eight, any one of eight possible cases may arise with respect the number of data bits within the last byte 240. The first case arises when the total number of the data bits is a multiple of eight. In this case the data bits are perfectly divided in groups of eight with no data bits remaining, in which case the last byte 240 contains no data bits. The other seven cases arise when the total number of data bits is not a multiple of eight. In these seven cases, depending upon the total number of data bits, one to seven bits may remain in the last byte 240. The following summarizes the eight possible cases:

1) The last byte contains no data bits (the total number of bits is a multiple of eight).

2) The last byte contains 1 data bit (the total number of data bits is a multiple of eight plus 1 bit).

3) The last byte contains 2 data bits (the total number of data bits is a multiple of eight plus 2 bits).

4) The last byte contains 3 data bits (the total number of data bits is a multiple of eight plus 3 bits).

5) The last byte contains 4 data bits (the total number of data bits is a multiple of eight plus 4 bits).

6) The last byte contains 5 data bits (the total number of data bits is a multiple of eight plus 5 bits).

7) The last byte contains 6 data bits (the total number of data bits is a multiple of eight plus 6 bits).

8) The last byte contains 7 data bits (the total number of data bits is a multiple of eight plus 7 bits).

The information as to which of the above eight cases has arisen, or in other words, the bit length information of the last byte 240, need to be communicated to the receiver. In accordance with the present invention, the last byte itself is used to provide such information to the receiver. In order to do so, a special format is used in representing the bit information in the last byte 240. FIG. 3b shows eight different representations for the last byte, wherein each of the eight representations correspond to one of the above described eight cases. In FIG. 3b, d0–d6 designate bit positions occupied by data bits. The first row of entry in FIG. 3b is properly called "0 bits", referring to the case where no data bits exist within the last byte 240; the second row of entry is called "1 bit", referring to the case where the last byte 240 contains 1 bit of data; the third row of entry is called "2 bits", referring to the case where the last byte 240 contain 2 bits of data; the forth row of entry is called "3 bits", referring to the case where the last byte 240 contains 3 bits of data; the fifth row of entry is called "4 bits", referring to the case where the last byte 240 contains 4 bits of data; the sixth row of entry is called "5 bits", referring to the case where the last byte 240 contains 5 bits of data; the seventh row of entry is called "6 bits", referring to the case where the last byte 240 contain 6 bits of data; the eight row of entry is called "7 bit", referring to the case where the last byte 240 contains 7 bit of data.

Upon receiving the last byte 240, the receiver would use the following criterion in examining the contents of the last byte 240: Starting from the least significant bit position, the bit value in each bit position is examined. Detection of a "0" would indicate a bit position not occupied by data, while the detection of a "1" would indicate that all the subsequent bit positions contain data bits. For example, in examining the bit positions of the "2 bits" entry in FIG. 3-b, the least significant bit position, which contains a "0", is first examined. Upon detecting the "0", indicating a non-data bit position, the next bit position is examined. This process is continued until the sixth bit position containing a "1" is detected. Upon detecting the "1", the receiver will simply receive the remaining bits, d0 and d1, as data bits. As can be seen, compared to the prior art methods, very little overhead is used in communicating to the receiver the information as to the bit length of the last byte 240.

In the case where the total number of data bits is a multiple of eight, an additional byte is needed in order to properly identify the end of the string of data bits. This case corresponds to the "0 bits" entry in FIG. 3b. The most significant bit position containing a "1" indicates that no data bits exist in this byte. It is only in this case that no savings are achieved as compared to the prior art. In all other cases (⅞th of the cases) one less byte is required in representing the string of data.

In the above description, an implicit assumption is that the receiver is pre-conditioned such that it always manipulates the last byte 240 of the data field 230 according to the criterion described above. For example, in transmitting a total of 20 bytes of information, the receiver will treat the 20th byte in accordance with the above mentioned criterion.

The use of the 0s and 1s in FIG. 3b are arbitrary. For example contrary to what is shown in FIG. 3a, a high logic level (1) may be used to represent the bit positions not occupied by data bits, in which case a low logic level (0) should be used in the bit position which separates the data bits from non-data bits.

Furthermore, in FIG. 3b the order in which the data bits (d0–d6) are arranged is arbitrary. For example, as shown in FIG. 3b, the data bits may be arranged sequentially starting at the most significant bit position, in which case the bit value in each bit position is examined sequentially starting with the least significant bit position; or alternatively, the data bits may be arranged sequentially starting at the least significant bit position, in which case the bit value in each bit position is examined sequentially starting with the most significant bit position.

A software implementation of the above specific embodiment is shown in FIG. 4. The program routine in FIG. 4 is written in the C programming language, although other programming languages may be used to implement the routine. The program routine of FIG. 4 consists of two sections—an encode section, consisting of lines 1–5, and a decode section, consisting of lines 6–13.

Prior to transmission of the data, the transmitter encodes the last byte in accordance with lines 1–5 of the program routine. In line 3 of the routine, a "1" is shifted into the position after the last data bit. In line 4, depending on how many bit positions remain in the last byte, 0–7 zeros are shifted into the bit positions after the "1".

Upon receiving the bytes of data, the receiver decodes the last byte in accordance with lines 6–13 of the program routine. Lines 9–11 represent a sub-routine whereby the zeros in the last byte are discarded. In line 12, the trailing 1 is discarded.

Once again, the use of zeros and ones in the program routine of FIG. 4 is arbitrary. Also, bit arrangements other than a byte may be used.

The specific embodiment of the present invention shown in FIGS. 3a–3b may also be described in a mathematical sense as follows: a string of N bits can always be represented in (N+1)/8 bytes (rounded up). To represent a string of N bits in (N+1)/8 bytes (rounded up), the string of N bits is first grouped into groups of 8 bits or into N/8 bytes (rounded down). Depending upon the total number of bits, 0 to 7 bits may remain, for which one byte is designated.

FIG. 5 illustrates a communications system programmed to process and represent data according to the present invention. One of the previously illustrated data structures is represented and processed in the communications system of FIG. 5 using a transmitter (including a computer) 300 to arrange and send video image related data to a receiver (including a computer) 310.

The above description of the present invention is intended to be illustrative and not limiting. The invention is further intended to include all variations and modifications falling within the scope of the appended claims.

I claim:

1. For use in a communication system having a computer arrangement for processing and representing information as a string of data bits, a method for execution by the computer arrangement comprising:

sequentially arranging said string of data bits in fixed-size bit groups starting with a first group and ending with a last group, each group having an equal number of bit positions, wherein in said last group one or more bit positions remain unoccupied by data bits;

after sequentially arranging said string of data bits, communicating the information by transmitting said string of data bits;

receiving the transmitted string of data bits; and after receiving the transmitted string of data bits, identifying said one or more unoccupied bit positions in said last group using a predesignated format.

2. A method as recited in claim 1 further comprising the step of examining the bit value in each bit position of said last group in the sequence opposite said sequence of arranging said string of data bits, whereby the detection of a predesignated bit value indicates that all subsequent bit positions contain data bits.

3. A method as recited in claim 2 further comprising the steps of:

sequentially arranging said string of data bits in said fixed-size bit groups starting at the most significant bit position of each bit group; and sequentially examining the bit value in each bit position of said last group starting with the least significant bit position.

4. A method as recited in claim 3 further providing, said predesignated bit value is a high logic level which occupies one of said unoccupied bit positions, and the remaining unoccupied bit positions, if any, are represented by a low logic level.

5. A method as recited in claim 3 further providing, said predesignated bit value is a low logic level and occupies one of said unoccupied bit positions, and the remaining unoccupied bit positions, if any, are represented by a high logic level.

6. A method as recited in claim 2 further comprising the steps of:

sequentially arranging said string of data bits in said fixed-size bit groups starting at the least significant bit position of each bit group; and sequentially examining the bit value in each bit position of said last group starting with the most significant bit position.

7. A method as recited in claim 6 further providing, said predesignated bit value is a high logic level which occupies one of said unoccupied bit positions, and the remaining unoccupied bit positions, if any, are represented by a low logic level.

8. A method as recited in claim 6 further providing, said predesignated bit value is a low logic level and occupies one of said unoccupied bit positions, and the remaining unoccupied bit positions, if any, are represented by a high logic level.

9. A communications system having a transmitter and a receiver, the system comprising: a computer arrangement having a computer program that, when executed by the computer arrangement, causes the computer arrangement to represent information as a string of data bits sequentially in fixed size bit groups starting with a first group and ending with a last group, each group having a predetermined number of bit positions, wherein the last group is arranged in one of the following two arrangements:

in the last group less than all bit positions are occupied by a data bit and a predesignated format is used in the last group to identify any bit positions that are occupied by data bits, and in the last group one or more bit positions remain unoccupied by data bits, and a predesignated format is used in the last group to identify the one or more unoccupied bit positions; and the transmitter configured and arranged to communicate the information by transmitting the information represented as the string of data bits to the receiver.

10. For use in a communications system having a transmitter and a receiver, a computer arrangement comprising a computer program that, when executed by the computer arrangement, causes the computer arrangement to represent information as a string of data bits sequentially in fixed size bit groups starting with a first group and ending with a last group, each group having a predetermined number of bit positions, wherein the last group is arranged in one of the following two arrangements:

less than all bit positions in the last group are occupied by a data bit and a predesignated format is used in the last group to identify any bit positions that are occupied by data bits, and one or more bit positions in the last group remain unoccupied by data bits, and a predesignated format is used in the last group to identify the one or more unoccupied bit positions; and the transmitter configured and arranged to communicate the information by transmitting the information represented as the string of data bits to the receiver.

11. A method executable by a computer arrangement in a communication system having a transmitter and a receiver, the computer arrangement having a computer program that, when executed by the computer arrangement, causes the computer arrangement to perform steps, comprising:

representing information as a string of data bits sequentially in fixed size bit groups starting with a first group and ending with a last group, each group having a predetermined number of bit positions; and arranging the last group in one of the following two arrangements:

less than all bit positions are occupied by a data bit and a predesignated format is used in the last group to identify any bit positions that are occupied by data bits, and one or more bit positions remain unoccupied by data bits, and a predesignated format is used in the last group to identify the one or more unoccupied bit positions; and after sequentially arranging said string of data bits, communicating the information by transmitting said string of data bits to the receiver.

* * * * *

UNITED STATES PATENT AND TRADEMARK OFFICE
CERTIFICATE OF CORRECTION

PATENT NO. : 5,793,984
DATED : August 11, 1998
INVENTOR(S) : HELMAN

It is certified that error appears in the above-identified patent and that said Letters Patent is hereby corrected as shown below:

Col. 3, line 32: "with respect the" should read --with respect to the--.

Col. 4, line 9: "contain" should read --contains--.

Col. 4, line 17, "7 bit" should read --7 bits--.

Col. 4, line 18, "bit" should read --bits--.

Col. 4, line 52, "example contrary" should read --example, contrary--.

Signed and Sealed this

Twenty-eighth Day of November, 2000

Attest:

Attesting Officer

Q. TODD DICKINSON
Director of Patents and Trademarks